United States Patent [19]

Ballance et al.

[11] Patent Number: 5,436,029

[45] Date of Patent: Jul. 25, 1995

US005436029A

[54] CURING SILICON HYDRIDE CONTAINING MATERIALS BY EXPOSURE TO NITROUS OXIDE

[75] Inventors: David S. Ballance; Marie N. Eckstein; Mark J. Loboda; Keith W. Michael, all of Midland; Liberty B. Shelton, Farmington, all of Mich.

[73] Assignee: Dow Corning Corporation, Midland, Mich.

[21] Appl. No.: 994,225

[22] Filed: Dec. 21, 1992

Related U.S. Application Data

[63] Continuation-in-part of Ser. No. 912,436, Jul. 13, 1992, abandoned.

[51] Int. Cl.6 .............................................. B05D 5/12
[52] U.S. Cl. ................................. 427/126.2; 427/226; 427/240; 427/376.2; 427/377; 427/387; 427/397.7; 427/421; 427/430.1
[58] Field of Search ...................... 427/126.2, 226, 240, 427/376.2, 377, 387, 421, 430.1, 397.7

[56] References Cited

U.S. PATENT DOCUMENTS

| | | | |
|---|---|---|---|
| 3,615,272 | 10/1971 | Collins et al. | 423/325 |
| 4,756,977 | 7/1988 | Haluska et al. | 428/704 |
| 4,847,162 | 7/1989 | Haluska et al. | 428/457 |
| 4,999,397 | 3/1991 | Weiss et al. | 427/58 |
| 5,010,159 | 4/1991 | Bank et al. | 528/23 |
| 5,063,267 | 11/1991 | Hanneman et al. | 524/284 |
| 5,116,637 | 5/1992 | Baney et al. | 427/340 |
| 5,145,723 | 9/1992 | Ballance et al. | 427/397.7 |

OTHER PUBLICATIONS

Cotton et al, "Advanced Inorganic Chemistry", Section 12–6 Oxides Of Nitrogen, p. 341, (Feb. 1967).
The Merck Index, Eleventh Edition, "6575 Nitrous Oxide", p. 1051, (1990). [no month].
Desu et al., J Electrochem Soc., vol. 139, No. 9, Sep. 1992.

*Primary Examiner*—Anthony Green
*Attorney, Agent, or Firm*—Roger E. Gobrogge

[57] ABSTRACT

The present invention relates to a low temperature method of forming silica-containing ceramic coatings on substrates. The method involves applying a coating comprising a silicon hydride containing resin on a substrate and heating the coated substrate under an environment comprising nitrous oxide at a temperature sufficient to convert the resin to the silica-containing ceramic coating. This method is especially valuable for forming protective and dielectric coatings on electronic devices.

17 Claims, No Drawings

CURING SILICON HYDRIDE CONTAINING MATERIALS BY EXPOSURE TO NITROUS OXIDE

RELATED APPLICATIONS

This application is a continuation in part of Ser. No. 07/912,436, filed Jul. 13, 1992, now abandoned.

BACKGROUND OF THE INVENTION

The present invention relates to a method of forming silica-containing ceramic coatings on substrates such as electronic devices. These coatings can be used to provide hermetic protection to the underlying substrate or they can be used as dielectric layers.

The use of hydrogen silsesquioxane derived ceramic coatings on substrates such as electronic devices is known in the art. For instance, Haluska et al. in U.S. Pat. No. 4,756,977 disclose a process for forming silica-containing coatings on substrates such as electronic devices. The process described therein involves applying a solution of hydrogen silsesquioxane resin on a substrate followed by heating the coated substrate in air at a temperature in the range of 200°–1000° C. Since temperatures in the range of 600°–800° C. are required for complete conversion of the hydrogen silsesquioxane resin to silica, the method has limited utility when temperature sensitive substrates such as electronic devices are to be coated.

Other methods for converting hydrogen silsesquioxane resin to silica-containing materials at lower temperatures are also known in the art. For instance, U.S. Pat. No. 4,847,162 describes the conversion of hydrogen silsesquioxane resin to nitrified silica by heating in ammonia. Similarly, U.S. Pat. No. 5,116,637 describes the use of amines to assist in the conversion of hydrogen silsesquioxane resin to silica-containing materials. The agents used in these processes, however, may be corrosive or may present disposal concerns which limit their use in certain industry.

The present invention discloses that certain silicon hydride containing materials can be converted to silica-containing coatings at low temperatures by heating in an environment containing nitrous oxide.

SUMMARY OF THE INVENTION

The present invention relates to a method of forming a silica-containing ceramic coating on a substrate. The method comprises first applying a coating comprising a silicon hydride containing resin of the structure $(SiO_2)_x(RSiO_{3/2})_y(R_2SiO)_z$ on the substrate, wherein R independently comprises hydrogen or a hydrocarbon of 1 to 20 carbon atoms, y is a mole fraction between about 0.05 and 1, and x and z are mole fractions between about 0 and about 0.95, with the proviso that at least 20% of the R groups are hydrogen. The coated substrate is then heated in an atmosphere containing nitrous oxide at a temperature sufficient to convert the resin coating to a silica-containing ceramic coating. These methods are especially valuable for forming coatings on electronic devices.

DETAILED DESCRIPTION OF THE INVENTION

The present invention is based on the discovery that nitrous oxide ($N_2O$) accelerates the conversion of silicon hydride containing resinous coatings to silica-containing coatings at low temperatures. This discovery has a dramatic impact on the use of such resins for coating temperature sensitive substrates such as electronic devices since it avoids various problems with prior art low temperature conversion processes and agents. Such problems have included explosion and environmental concerns, the use of elevated temperatures, corrosivity of the curing agents, cracking and modification of the coating and availability of materials.

Because the process of the present invention avoids these disadvantages, they are particularly valuable for the deposition of coatings on substrates such as electronic devices or electronic circuits which are temperature sensitive and which require high quality coatings. Such coatings could serve, for example, as protective or dielectric coatings, interlevel dielectric layers, doped dielectric layers to produce transistor like devices, pigment loaded binder systems containing silicon to produce capacitor and capacitor-like devices, multilayer devices, 3-D devices, silicon on insulator devices, coatings for superconductors, super lattice devices and the like. The choice of substrates to be coated by the instant invention, however, is limited only by the need for thermal and chemical stability of the substrate under the conditions used. It is also contemplated, therefore, that the process of the invention could be used on non-electronic substrates such as plastics including, for example, polyimides, epoxides, polytetrafluoroethylene and copolymers thereof, polycarbonates, acrylics, polyesters and the like.

As used in the present invention, the expression "silica-containing ceramic" is meant to include both amorphous silica ($SiO_2$) materials as well as amorphous silica-like materials that are not fully free of residual carbon, silanol (Si—OH) and/or hydrogen and which may contain additional ceramic materials. Such silica-containing ceramic materials may have variable densities depending on the temperature and time of heating. The expressions "electronic device" or "electronic circuit" include, but are not limited to, silicon based devices, gallium arsenide based devices, focal plane arrays, optoelectronic devices, photovoltaic cells and optical devices.

In the present invention, a silica-containing ceramic coating is formed on a substrate by a process which comprises coating the substrate with a composition comprising a silicon hydride (Si—H) containing resin and then heating the coated substrate in an environment comprising nitrous oxide.

The silicon hydride containing resins useful in this invention comprise materials of the structure $(SiO_2)_x(RSiO_{3/2})_y(R_2SiO)_z$, wherein R independently comprises hydrogen or a hydrocarbon of 1 to 20 carbon atoms, y is a mole fraction between about 0.05 and 1, and x and z are mole fractions between about 0 and about 0.95, with the proviso that at least 20% of the R groups are hydrogen. R in the above formula, therefore, can include, for example, hydrogen, alkyls such as methyl, ethyl, propyl, butyl, etc., cycloalkyls such as cyclohexyl, aryls such as phenyl, aralkyls, alkaryls, and unsaturated alkyls such as vinyl, ethynyl, etc. It is also within the scope of this invention that the above resins not be fully hydrolyzed or condensed such that the resin contains residual hydrolyzable groups such as halogens or alkoxys or residual Si—OH groups.

Examples of the above materials, therefore, comprise $HSiO_{3/2}$, $(HSiO_{3/2})_y(H_2SiO)_z$, $(CH_3SiO_{3/2})_y(CH_3HSiO)_z$, $(HSiO_{3/2})_y((CH_3)_2SiO)_z$, $(HSiO_{3/2})_y(CH_3HSiO)_z$, $(CH_3CH_2SiO_{3/2})_y(H_2SiO)_z$, $(C_5H_6SiO_{3/2})_y(CH_3CH_2$ HSiO)$_z$, (SiO$_2$)$_x$(HSiO$_{3/2}$)$_y$(CH$_3$HSiO)$_z$, (SiO$_2$)$_x$(HSiO$_{3/2}$)$_y$(H$_2$SiO)$_z$ and the like.

A particularly preferred material useful herein comprises (HSiO$_{3/2}$)$_n$ (hydrogen silsesquioxane resin or H-resin) wherein n is an integer greater than or equal to 8. These resins may be fully condensed (HSiO$_{3/2}$)$_n$ or they may be only partially hydrolyzed (i.e., containing some Si—OR) and/or partially condensed (i.e., containing some Si—OH). Although not represented by this structure, these resins may contain a small number (e.g., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

As noted above, resins other than H-resin are also functional herein. For instance, the resin of the invention may contain other RSiO$_{3/2}$ units such as CH$_3$SiO$_{3/2}$, CH$_3$CH$_2$SiO$_{3/2}$, C$_6$H$_5$SiO$_{3/2}$ and the like. These materials and methods for their preparation are known in the art. Generally, however, such materials are produced by the hydrolysis and condensation of silanes of the structure RSiX$_3$, wherein X is a hydrolyzable substituent.

Similarly, the resin of the invention may contain other R$_2$SiO units such as CH$_3$HSiO, CH$_3$CH$_2$HSiO, C$_6$H$_5$HSiO, (CH$_3$)$_2$SiO, (CH$_3$CH$_2$)$_2$SiO, C$_6$H$_5$CH$_3$SiO and the like. These materials and methods for their preparation are likewise known in the art. Generally, however, such materials are produced by the hydrolysis and condensation of silanes of the structure RZSiX$_2$, wherein X i s a hydrolyzable substituent.

Finally, the resins of the invention may contain SiO$_2$ units. Such units are generally produced by the hydrolysis and condensation of silanes of the structure SiX$_4$ wherein X i s a hydrolyzable substituent.

When materials containing more than one of the above units are desired, they can be produced by cohydrolysis of the above silanes or by hydrolyzing each silane individually and mixing the hydrolyzates.

The silicon hydride containing resin coating material may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When silicon hydride-containing resin is to be combined with one of the above ceramic oxide precursors, generally it is used in an amount such that the final ceramic coating contains 70 to 99.9 percent by weight SiO$_2$.

The silicon hydride containing resin coating material may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst RhCl$_3$[S(CH$_2$CH$_2$CH$_2$CH$_3$)$_2$]$_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of silicon hydride containing resin.

The silicon hydride containing resin coating material may also contain fillers such as silica or alumina. Such fillers are known in the art for abrasion resistant coatings and for use in epoxy resin encapsulants. These filler may be used at nearly any level such as about 1 to 70 weight percent based on the total weight of the resin composition.

According to the process of the invention, the silicon hydride containing resin and, optionally, any ceramic oxide precursors, fillers and/or catalysts are applied to the surface of a substrate. This can be accomplished in any manner, but a preferred method involves dissolving the resin in a solvent to form a solution or dispersion which is applied to the surface of the substrate. Various facilitating measures such as stirring and/or heating may be used to dissolve or disperse the resin and create a more uniform application solution/suspension. Solvents which may be used include any agent or mixture of agents which will dissolve or disperse the resin to form a homogenous solution without affecting the resultant coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1–50 weight percent solution.

If a solution method is used, the solution comprising the resin, solvent, and, optionally, a modifying ceramic oxide precursor, filler and/or a catalyst is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the silicon hydride containing resin coating. Any suitable means of evaporation may be used such as simple air drying by exposure to an ambient environment, by the application of a vacuum or mild heat (e.g., less than 50° C.) or during the early stages of the heat treatment. It is to be noted that when spin coating is used, the additional drying period is minimized as the spinning drives off the solvent.

Once the resin coating is applied, it is then heated in an environment containing nitrous oxide at a temperature sufficient to convert it to a silica-containing material. During this conversion, factors such as nitrous oxide gas concentration, gas exposure time, temperature and heating time all need to be controlled.

The nitrous oxide used in this process is known in the art and commercially available. It may be used in this invention in its neat form or it may be diluted in additional gases (e.g., inert gases such as argon, nitrogen, etc. or reactive gases) to a concentration sufficient to convert the resin to silica at a desirable rate under the temperature conditions chosen.

The coating is generally exposed to this gas for a time sufficient to convert the resin to silica. Generally, times in the range of several minutes to several hours are useful (e.g., 2 minutes to 2 hours). This exposure can occur during the ramp-up, during the heat soak or during ramp-down.

As noted above, it is also contemplated herein that the resin may be concomitantly or sequentially exposed to other reactive environments which assist in its conversion. For instance, it is within the scope of this invention to also expose the resin to water vapor (e.g., steam), ammonia, amines, other oxidizing gases and the like. Similarly, it is also contemplated that the coating can first be heated under an inert environment to allow the coating to flow as described in U.S. Pat. No. 5,145,723 and then exposed to the nitrous oxide environment to allow for conversion to silica.

Generally, the temperatures useful herein are in the range of about 100° C. to about 600° C. Higher and lower temperatures, however, are also contemplated in the invention. For example, lower temperatures may be used but they often result in incomplete conversion of the resin to silica and insufficient densification of the ceramic. Similarly, higher temperatures (e.g., 1000° C.) may be used but the need for nitrous oxide is diminished since resin can generally be converted to silica at such temperatures in air.

Generally, the coated substrates are heated under the nitrous oxide containing environment for a time sufficient to convert the resin to silica. Time periods in the range of a few minutes for very thin films to several hours for very thick films, depending on the temperature, are generally useful herein. It is particularly preferred to heat the coated substrates at a temperature of about 300°–600° C. for about 1–3 hours.

Any method of heating such as the use of a quartz tube furnace, a convection oven, reverse direction processing as described in U.S. patent application Ser. No. 07/633,707, now allowed and assigned to the same assignee hereof, or radiant or microwave energy is generally functional herein. Similarly, the rate of heating is generally not a critical factor, but it is most practical and preferred to heat the substrate as rapidly as possible.

Although not wishing to be bound by theory, the inventors herein postulate that when the nitrous oxide is heated it forms a reactive ion which cleaves the Si—H bonds and, thus, crosslinks the resin.

By the above methods a thin (less than 2 microns) silica-containing ceramic planarizing coating is produced on the substrate. The coating smooths the irregular surfaces of various substrates and has excellent adhesive properties. In addition, the coating may be covered by other coatings such as additional $SiO_2$ layers, silicon containing coatings, silicon carbon containing coatings, silicon nitrogen containing coatings, silicon oxygen nitrogen containing coatings and/or silicon nitrogen carbon containing coatings. Such multiple layer coatings are known in the art and many are described in U.S. Pat. No. 4,756,977 which is hereby incorporated by reference.

Coatings produced by the instant invention possess low defect density and are useful on electronic devices as protective coatings, as corrosion resistant and abrasion resistant coatings, as temperature and moisture resistant coatings, as dielectric layers and as a diffusion barrier against ionic impurities such as sodium and chloride.

The following non-limiting examples are included so that one skilled in the art may more readily understand the invention.

EXAMPLE 1

Hydrogen silsesquioxane resin made by the method of Collins et al. in U.S. Pat. No. 3,615,273 was diluted to 10% in methyl isobutylketone. The H-resin solution was applied to the surface of a 4 inch round silicon wafer and the wafer was spun at 3000 rpm for 10 seconds. The wafer was then placed in a 1 L 2 inch quartz tube furnace at room temperature and the temperature in the furnace ramped to 425° C. over 45 minutes followed by a heat soak at 425° C. for 1 hour. A flow of nitrous oxide at 0.2–0.3 inches of water was run through the furnace during the ramp-up and the hold at temperature (Approximately 50 sccm). After the 1 hour heat soak, heating was discontinued and the furnace was purged with 100 sccm nitrogen.

Infrared spectroscopy data on the coating showed that the peak at 2259 $cm^{-1}$ indicative of Si—H was nearly completely gone and the doublet at 1100 $cm^{-1}$ and 900 cm, representative of the Si—O structures in the resin, were converted into single bands at 1070 $cm^{-1}$ and 800 $cm^{-1}$ which is indicative of crosslinking of the polymer into oxide tetrahedra. Both indicate a good conversion of the H-resin to a silica-containing coating.

EXAMPLE 2

Hydrogen silsesquioxane resin made by the method of Collins et al. in U.S. Pat. No. 3,615,273 was diluted to 10% in methyl isobutylketone. The H-resin solution was applied to the surface of a 4 inch round silicon wafer and the wafer was spun at 3000 rpm for 10 seconds. The wafer was then placed in a 1 L 2 inch quartz tube furnace at room temperature and the temperature in the furnace ramped to 425° C. over 45 minutes followed by a heat soak at 425° C. for 1 hour. A flow of nitrous oxide at 0.2-0.3 inches of water was run through the furnace during the ramp-up and the hold at temperature (Approximately 50 sccm). In addition, 1.2 standard liters per minute of steam (101° C.) was added to the gas mixture (ratio of steam:$N_2O$=20:1) during the first 10 minutes of the heat soak (approximately 10 ml/10 min). After the 1 hour heat soak, heat was discontinued and the furnace was purged with 100 sccm nitrogen.

FTIR data on the coated wafer showed that the peak at 2259 $cm^{-1}$ indicative of Si—H had completely disappeared and the doublet at 1100 $cm^{-1}$ and 900 $cm^{-1}$, representative of the Si—O structures in the resin, were converted into single bands at 1070 $cm^{-1}$ and 800 $cm^{-1}$ which is indicative of crosslinking of the polymer into oxide tetrahedra. Both indicate a good conversion of the H-resin to a silica-containing coating.

What is claimed is:

1. A method of forming a silica-containing ceramic coating on a substrate comprising:
   applying a coating comprising a silicon hydride resin of the structure $(SiO_2)_x(RSiO_{3/2})_y(R_2SiO)_z$ on the substrate, wherein R independently comprises hydrogen or a hydrocarbon of 1 to 20 carbon atoms, y is a mole fraction between about 0.05 and 1, and x and z are mole fractions between about 0 and about 0.95, with the proviso that at least about 20% of the R groups are hydrogen; and
   heating the coated substrate in an atmosphere comprising nitrous oxide at a temperature sufficient to convert the silicon hydride resin coating to a silica-containing ceramic coating.

2. The method of claim 1 wherein the silicon hydride resin comprises hydrogen silsesquioxane resin.

3. The method of claim 1 wherein the silicon hydride resin comprises $(HSiO_{3/2})_y(H_2SiO)_z$.

4. The method of claim 2 wherein the hydrogen silsesquioxane resin is applied to the substrate by a process which comprises coating the substrate with a solution comprising a solvent and the hydrogen silsesquioxane resin and then evaporating the solvent.

5. The method of claim 4 wherein the substrate is an electronic device.

6. The method of claim 4 wherein said solution is coated onto the substrate by spray coating, dip coating, flow coating or spin coating.

7. The method of claim 1 wherein the coated substrate is heated at a temperature in the range of between about 100° C. and about 600° C. for between about 1 and 3 hours.

8. The method of claim 2 wherein the hydrogen silsesquioxane resin is fractionated into polymeric species such that at least 75% of the polymeric species have a molecular weight between about 1200 and about 100,000.

9. The method of claim 2 wherein the resin contains residual Si—OH and Si—OR' bonds, wherein R' comprises a hydrocarbon of 1-20 carbon atoms.

10. The method of claim 1 wherein the silicon hydride resin coating also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the silica containing ceramic coating contains 0.1 to 30 percent by weight modifying ceramic oxide.

11. The method of claim 1 wherein the silicon hydride resin coating also contains a platinum or rhodium catalyst in an amount of between about 5 and about 500 ppm platinum based on the weight of resin.

12. The method of claim 1 wherein the silicon hydride resin coating also contains fillers.

13. The method of claim 1 wherein the heating atmosphere also contains an inert gas.

14. The method of claim 1 wherein the heating atmosphere also contains an additional reactive gas.

15. The method of claim 1 wherein the heating atmosphere also contains water vapor.

16. The method of claim 1 wherein the coated substrate is first heated in an inert environment to allow the coating to flow and then in the nitrous oxide.

17. The method of claim 1 wherein the coated substrate is only exposed to the nitrous oxide during a portion of the heating.

* * * * *